United States Patent [19]

Yaguchi

[11] Patent Number: 5,159,263

[45] Date of Patent: Oct. 27, 1992

[54] LSI SYSTEM HAVING A TEST FACILITATING CIRCUIT

[75] Inventor: Toshiyuki Yaguchi, Tokyo, Japan

[73] Assignee: Kabushiki Kaisha Toshiba, Kawasaki, Japan

[21] Appl. No.: 616,030

[22] Filed: Nov. 20, 1990

[30] Foreign Application Priority Data

Nov. 28, 1989 [JP] Japan ................................. 1-306442

[51] Int. Cl.$^5$ ............................................ G01R 31/06
[52] U.S. Cl. ............................... 324/158 R; 324/73.1; 371/15.1; 371/22.5
[58] Field of Search ............... 324/158 R, 158 T, 73.1; 371/22.3, 22.6, 22.5, 22.1, 27; 437/8; 307/303.1, 303.2

[56] References Cited

U.S. PATENT DOCUMENTS

| | | | |
|---|---|---|---|
| 4,181,940 | 1/1980 | Underwood et al. | 364/200 |
| 4,371,754 | 2/1983 | De et al. | 179/18 |
| 4,707,833 | 11/1987 | Tamaru | 371/22.3 |
| 4,802,163 | 1/1989 | Hirabayashi | 371/22.3 |
| 4,821,269 | 4/1989 | Jackson et al. | 371/22.1 |
| 4,970,454 | 11/1990 | Stambaugh et al. | 324/158 T |
| 5,036,272 | 7/1991 | Cho et al. | 324/158 T |

FOREIGN PATENT DOCUMENTS 0045836  2/1982  European Pat. Off. .

Primary Examiner—Vinh Nguyen
Attorney, Agent, or Firm—Foley & Lardner

[57] ABSTRACT

Disclosed is a test facilitating circuit which is incorporated in an LSI system having a plurality of master modules and a plurality of slave modules, a common bus for connecting the master modules and the slave modules, and a bus arbiter for adjusting use of the common bus. The test circuit utilizes tri-state buffers and control lines for prohibiting transmission of an acknowledgement signal from the bus arbiter to a master module to be tested among the plurality of master modules in a test mode. The test circuit inputs an acknowledgement signal generated from the master module, and which outputs it to the slave modules. An AND gate is used for masking acknowledgement signals to be transmitted from the bus arbiter to master modules other than the master module to be tested. A test I/O bus is used (comprising control lines and data lines) for carrying out initial setting to a memory portion in the master module to be tested, and reading data stored in the memory portion; and an ordinary operation control line sets the master module and the slave modules into an ordinary operation mode.

7 Claims, 4 Drawing Sheets

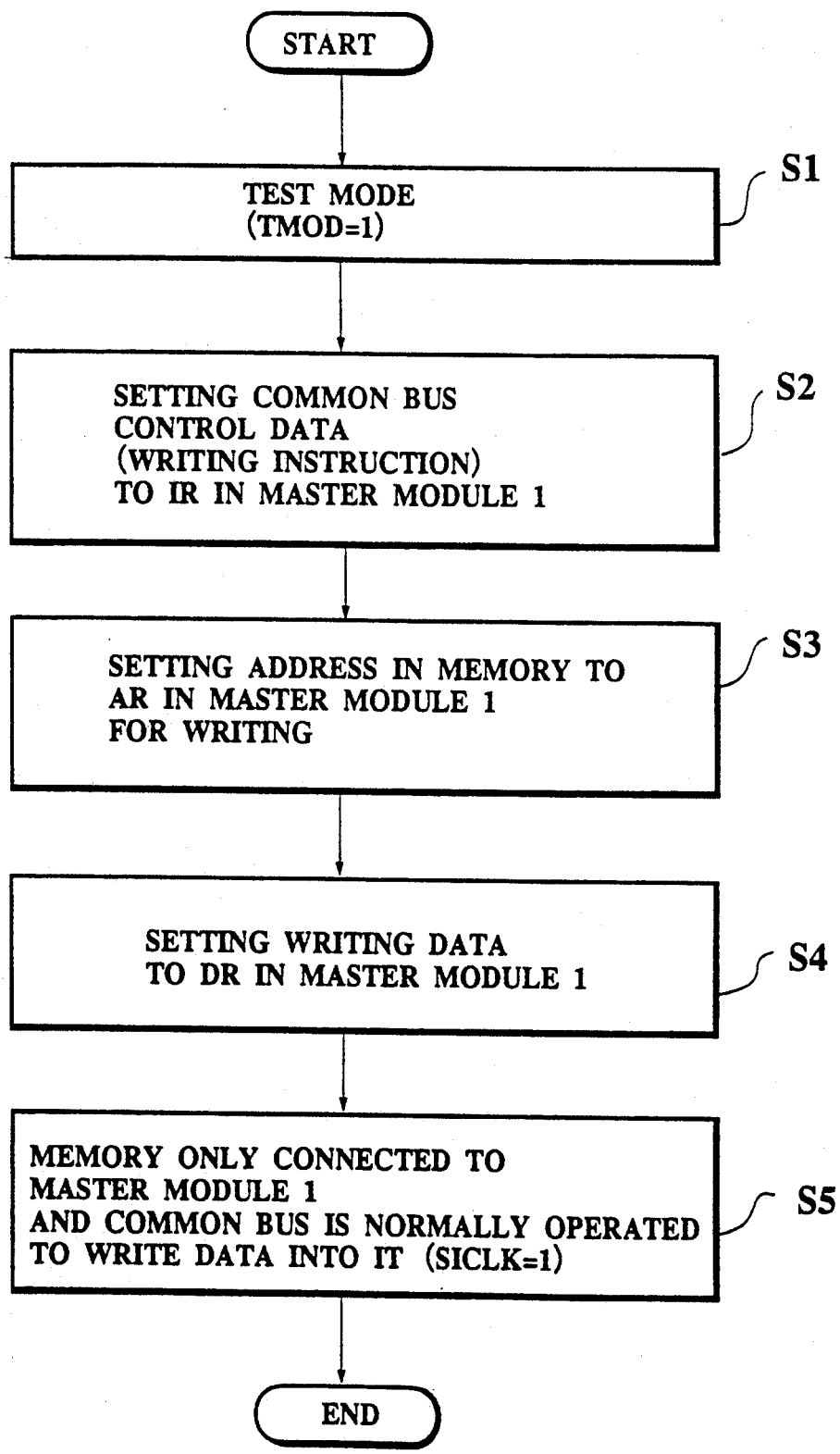

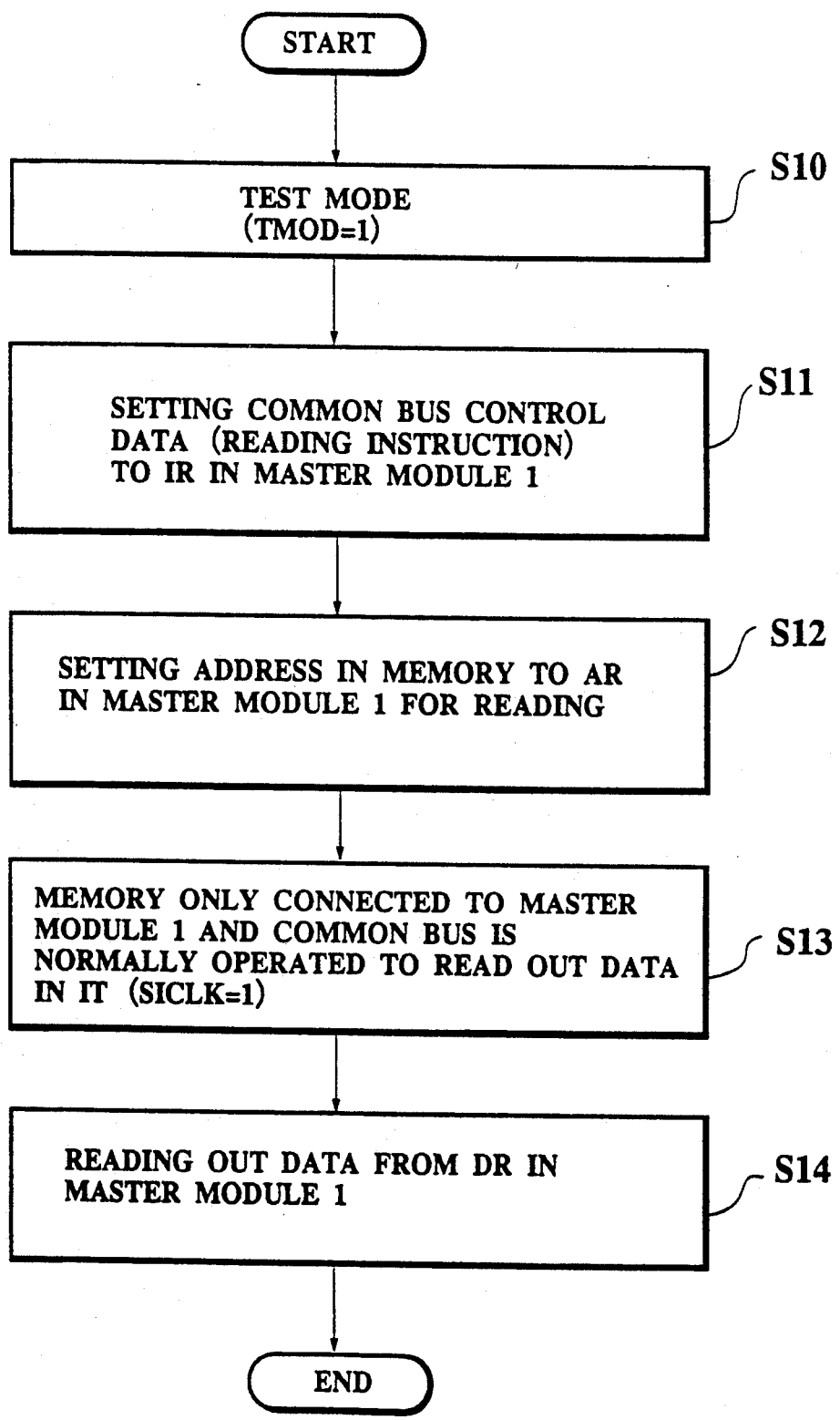

LSI SYSTEM HAVING A TEST FACILITATING CIRCUIT

BACKGROUND OF THE INVENTION

1. Field of the Invention

The present invention relates to a test facilitating circuit provided in an LSI system, and particularly to construction of a test facilitating circuit provided in an LSI system so constructed that a plurality of master modules can access a plurality of slave modules.

2. Description of the Prior Art

When an operational test of an LSI system constructed so that a plurality of master modules, for example, Central Processing Units (CPU) or Direct Access Memory Controllers (DMAC) are connected with a common bus to access a plurality of slave modules is carried out, it is necessary to set or read test data to each slave module (for example, a RAM as a memory element) which is dependent on each of the master modules.

Conventionally, a parallel scan method or a serial scan method is used as a method of testability on logic circuits.

Generally, in the parallel scan method, addresses of respective modules, for example memory circuits, in a logic circuit are selected as test data so as to carry out the operational test of the logic circuits.

However, in such a method, a test facilitating circuit (for example, address buses, data buses, and selectors only used for the operational tests) must be provided to each of the modules. The LSI scale of the system therefore is inevitably increased.

On the other hand, the serial scan method is used for operational tests of, for example, F/F and the like in the master modules. In this method, the number of circuits for the operational tests is smaller than that of the parallel scan method, however, the test time is longer than that of the other method. This problem increases as the integration degree of LSI becomes large.

In efficiency of the test time, the parallel scan method is superior to the serial scan method. However, the parallel scan method is inferior to the serial scan method in that the former method requires a larger scale test circuit than that of the latter.

SUMMARY OF THE INVENTION

It is an object of this invention to provide a test facilitating circuit in an LSI system having a relatively small circuit scale, and able to carry out operational tests with high efficiency.

To achieve the above object, the test facilitating circuit according to the present invention is provided in an LSI system having a plurality of master modules, a plurality of slave modules, a common bus for connecting the master modules and the slave modules, and adjusting means for adjusting use of the common bus, comprises acknowledgement means for prohibiting transmission of an acknowledgement signal to be transmitted from the adjusting means to a first master module to be tested in the master modules in a test mode, inputting an acknowledgement signal generated from the first master module, and outputting it to the slave modules, mask means for masking acknowledgement signals transmitted from the adjusting means to master modules other than the first master module, input-output means for carrying out initial setting to a memory portion in the first master module, and reading data held in the memory portion in the test mode, and ordinary operation means for setting the first master module and the slave modules in ordinary operation mode.

Namely, the test facilitating circuit according to the present invention, the transmission of acknowledgement signals from the adjusting means to the first master module is prohibited in the test mode. Then, the acknowledgement signals to be transmitted from the adjusting means to the master modules other than the first master module are masked by the mask means. Thereafter, the initial setting of test data to the memory portion in the first master module is carried out through the input-output means. Next, the system is operated by the ordinary operation means so as to set or read the test data to or from the slave modules. Thereby, the test of writing operation is finished completely.

In addition, in the test of reading operations the system is again in the test mode, and the data stored in the slave modules is read out to finish the reading operation.

Accordingly, since the test facilitating circuit of the present invention can be realized in a small-scale construction, it becomes possible to limit increase of circuit size of an LSI system constructed with a plurality of master modules and a plurality of slave modules and reduce the period of test operation. Thus, it becomes possible to carry out tests with high efficiency.

These and other objects, feature and advantages of the present invention will be more apparent from the following description of a preferred embodiment, taken in conjunction with the accompanying drawings.

BRIEF DESCRIPTION OF THE DRAWINGS

FIG. 3A is a flow chart to explain a writing operation of the test facilitating circuit in a test mode of the LSI system shown in FIG. 2.

FIG. 3B is a flow chart to explain a reading operation of the test facilitating circuit in a test mode of the system LSI shown in FIG. 2.

DETAILED DESCRIPTION OF THE EMBODIMENT

Hereinafter, a preferred embodiment of a test facilitating circuit according to the present invention will be explained with reference to the drawings.

Incidentally, in the embodiment, construction of logic circuits as an example of an LSI system is explained.

Figure 1:
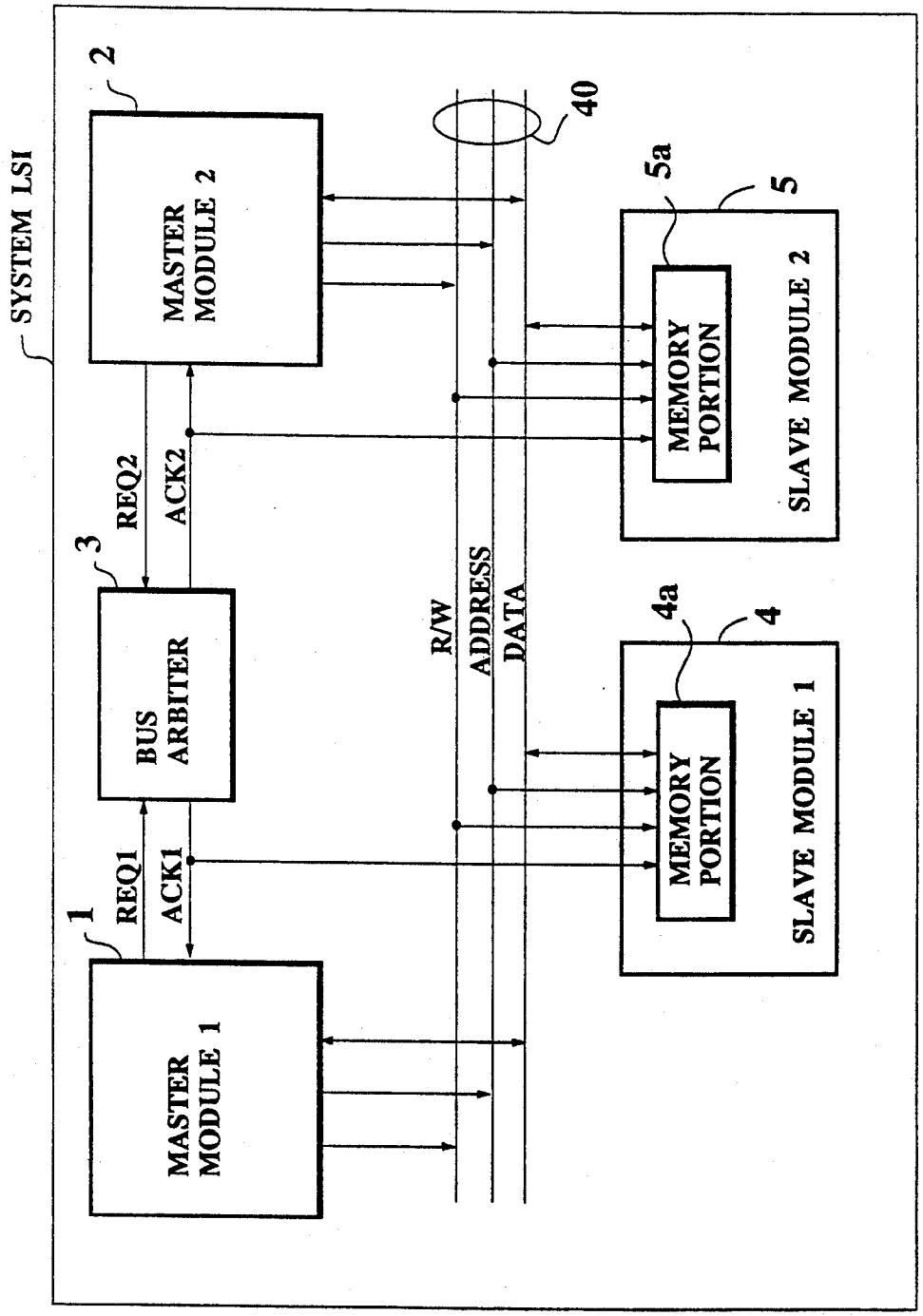
FIG. 1 is a schematic diagram of an LSI system having a plurality of logic circuits.

FIG. 1 shows a schematic diagram of the system having a plurality of logic circuits. The test facilitating circuit is not incorporated in the LSI system.

In the same drawing, reference numerals 1 and 2 show a first and a second master module, 3 shows a bus arbiter as adjusting means for deciding which of the master modules 1 and 2 uses a common bus 40, further 4 and 5 show slave modules. For example, with respect to operation of the master module 1, when a request signal REQ1 is outputted from the master module 1 to the bus arbiter 3, the bus arbiter 3 outputs a acknowledgement signal ACK1 to the master module 1. Next, the master module 1 starts its ordinary input/output operation of data to the slave module 4 through the common bus 40. While, with respect to operation of the master module 2, when a request signal REQ2 is given from the master module 2 to the bus arbiter 3, the bus arbiter 3 outputs an acknowledgement signal ACK2 to the master module 2. Then, the master module 2 starts its ordinary input/output operation of data to the slave module 5 through the common bus 40.

Next, an embodiment of a circuit for testability of according to the present invention will be described. Incidentally, to simplify the explanation, a case where the test facilitating circuit of the present invention is incorporated in the LSI system comprising a plurality of logic circuits as shown in FIG. 1 is described. As described in the following explanation, it should be clearly understood that this case as shown in FIG. 2 fully includes the essential constructional elements of the present invention.

Figure 2:
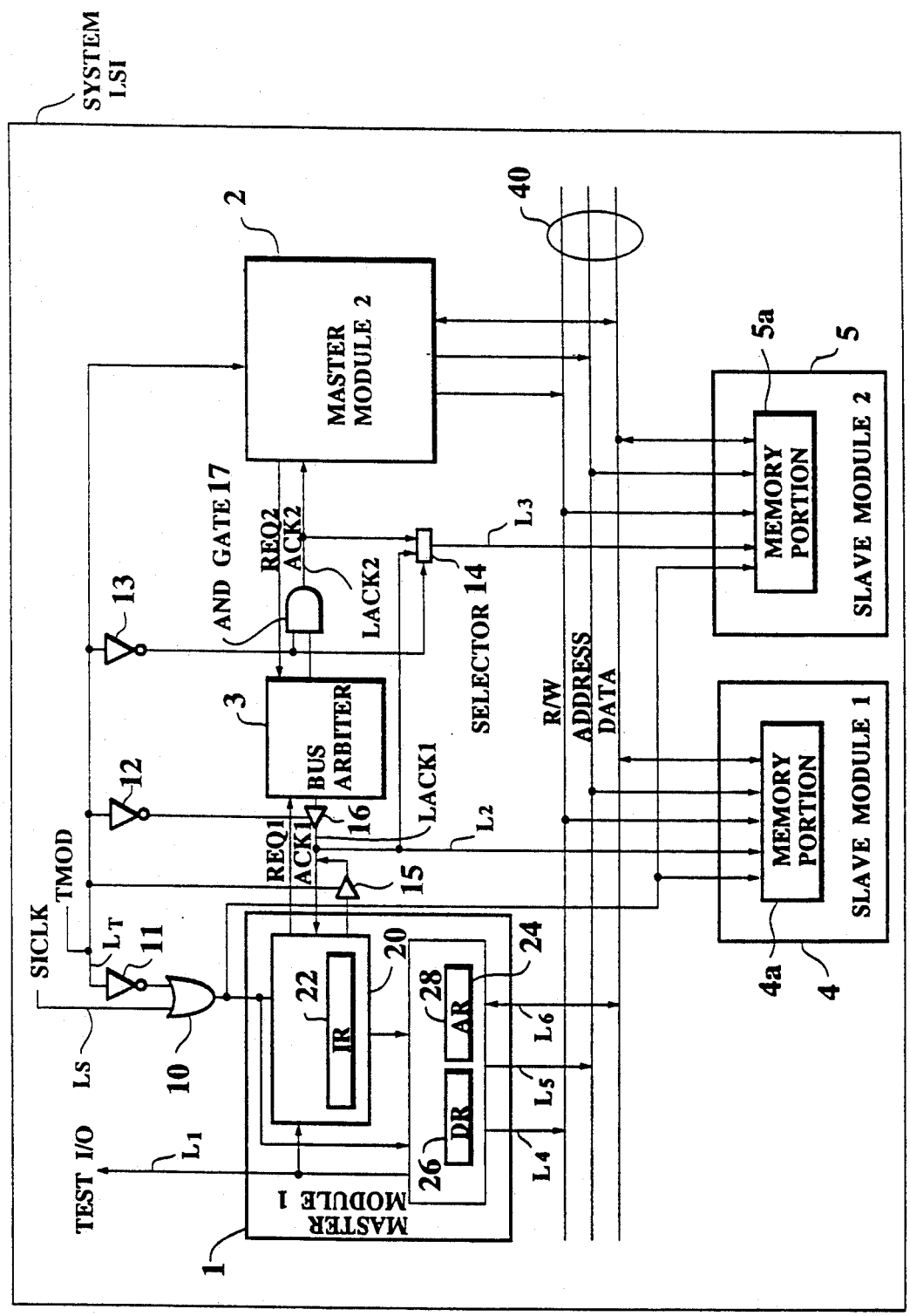
FIG. 2 is a schematic diagram to show a case where a test facilitating circuit of the present invention is provided in the LSI system shown in FIG. 1.

FIG. 2 shows a case where the test facilitating circuit of an embodiment of the present invention is incorporated in the LSI system shown in FIG. 1.

In FIG. 2, reference numerals 1 and 2 respectively show a first and a second master module, for example CPU or DMAC. Reference numeral 3 shows a bus arbiter as adjusting means for deciding which of the master modules 1 and 2 uses common buses 40. Further, 4 and 5 are slave modules, for example RAM. In the slave modules 4 and 5, memory portions 4a and 4b for storing data are incorporated.

In the master module 1, there are a state machine 20 and a bus interface 24 as a memory portion. The state machine 20 includes an instruction register (IR) 22 for storing an instruction. The bus interface 24 includes a data register (DR) 26 and an address register (AR) 28. Namely, as the memory portion in the master module 1, IR22, DR26 and AR28 are provided.

In such a logic circuit having the above-mentioned construction, the test facilitating circuit of the embodiment having such construction as described below is provided. Namely, as one of essential elements of the test facilitating circuit, a test mode control line LT for switching the operation mode of the logic circuit into a test mode is connected to the state machine 20 in the first master module 1 through an inverter 11 and an OR circuit 10. While, an ordinary operation mode control line LS for switching the operation mode of the logic circuit into an ordinary operation mode is connected to the state machine 20 in the first master module 1 through the OR circuit 10.

Furthermore, a tri-state buffer 16 for stopping transmission of acknowledgement signals to be transmitted from the bus arbiter 3 to the master module 1 on the test mode is provided in the course of a control line LACK1. The tri-state buffer 16 is subjected to tri-state control through an inverter 12 in the test mode. While, the output side of a tri-state buffer 15 for controlling transmission of signals from the master module 1 to the slave modules 1 and 2 is connected to the control line LACK1. Accordingly, in the test mode, an acknowledgement signal is given from the master module 1, then transmitted to an input terminal of acknowledgement signals of the memory portion 4a through the tri-state buffer 15, the control line LACK1, and a control line L2, and also transmitted to an input terminal of acknowledgement signals of the memory portion 5a through the control line L2, a selector 14 and a control line L3.

Incidentally, operation of the selector 14 is controlled by an inverter 13. Namely, in the test mode, the selector 14 selects an acknowledgement signal from the master module 1. While, in the ordinary mode, the selector 14 selects an acknowledgement signal from the bus arbiter 3, and outputs the signal to the slave module 5.

Moreover, operation of an AND gate 17 is controlled by the inverter 13. In the test mode, the acknowledgement signal given from the bus arbiter 3 is masked by the AND gate under control of the inverter 13, so that the signal is not transmitted to the master module 2.

Namely, in the embodiment, the acknowledgement means comprises the tri-state buffers 15 and 16, the inverter 12 and the selector 14.

While, the mask means is made up of the AND gate 17 and the inverter 13.

Moreover, the input-output means comprises a test I/O bus L1.

Furthermore, the switching means for switching ordinary operation and test operation comprises the ordinary control line LS, inverter 11, test mode control line LT and OR circuit 10.

Next, a procedure of the test operation in the test facilitating circuit of the embodiment having the above-mentioned construction is explained.

FIGS. 3a and 3b are flow charts to respectively show the test operation procedure. Namely, FIG. 3a is a flow chart to show a writing operation to the memory portions 4a and 5a, and FIG. 3b is a flow chart to show a reading operation from the memory portions 4a and 5a.

First, a data write test to the memory portions 4a and 5a is described.

In the test mode control line LT, a TMOD is set at the level 1. At the time, an SICLK is at the level 0. As the result, the ordinary operation in the logic circuit is stopped and the operation mode is changed into the test mode. In the test mode, the tri-state buffer 16, AND gate 17, selector 14 and master module 2 are in the test mode respectively through the tri-state buffer 15, and inverters 12 and 13.

While, the master module 1 becomes the test mode through the inverter 11 and OR gate 10. Morevover, the slave modules 4 and 5 are in the test mode respectively by inputting acknowledgement signals outputted from the master module 1 through the control lines L2 and L3. Moreover, the transmission of acknowledgement signals from the bus arbiter 3 to the first master module 1 is prohibited by the tri-state buffer 16. Furthermore, the acknowledgement signal to be transmitted from the bus arbiter 3 to master modules other than the master module 1, that is, the master module 2 in this embodiment, is masked by the AND gate 17 (Step S1).

In this situation, common bus control data (write instructions to the common buse 40) is set to the IR22 through the test I/O control line L1 (Step S2).

Then, addresses of the memory portions 4a and 5a in the slave modules 4 and 5 are written in the AR28 through the test I/O control line L1 (Step S3).

Subsequently, data is written into the DR26 through the test I/O control line L1 (Step S4).

Finally, the SICLK is set at the level 1 through the ordinary operation control line LS. As the result, the master module 1 and the memory portions 4a, 5a of the slave modules 4, 5 are respectively set in the ordinary operation mode, and acknowledgement signals are transmitted to the memory portions 4a and 5a through the tri-state buffer 15, control lines LACK1, and L2, selector 14 and control line L3.

Thereafter, the test data in the DR26 are written in the memory portion designated by the address value written in the AR28 through the common buses 40. Then, the write test is ended (Step S5).

Next, a data read test from the memory portions 4a and 5a will be explained.

The TMOD is set at the level 1 through the test mode control line LT so as to set the test operation mode. As the result, the ordinary operation is stopped. Since the operation is the same as the write test mentioned above, the explanation is omitted here (Step S10).

Then, common bus control data (read instructions from the common buses 40) are set to the IR22 through the I/O control line L1 (Step S11). Thereafter, the address of the data to be read out stored in the memory portion 4a or 5a are set in the AR28 through the test I/O control line L1 (Step S12).

Next, the SICLK is set at the level 1 through the ordinary operation control line LS. Then, the memory portion designated by the address held in the AR28 is set in the ordinary operation mode. As the result, the data of the memory portion designated by the address in the AR28 are read in the DR26 through the common bus 40 (Step S13).

Finally, the data of the DR26 are read from the test I/O control line L1. Then, the read test operation is ended (Step S14).

In such a manner, the test mode operation is completed. Namely, according to this embodiment, in a logic circuit constructed by the plurality of master modules and the plurality of the slave modules, since it becomes possible to provide a test facilitating circuit to each of the master modules and the slave modules operated thereby. Accordingly, the construction of the logic circuit can be simplified as comapared with the conventional art where the circuit for testability should be provided to every module.

Moreover, with respect to the test operation, since the input-output of test data is carried out only with the master module 1 as the center, high efficiency of the operation can be realized.

Furthermore, in this embodiment, a logic circuit as described, however, is also applicable to multi-processor systems having a common bus and pipeline operation systems for carrying out matrix operations.

Various modification will become possible for those skilled in the art after receiving the teachings of the present disclosure without departing from the scope thereof.

What is claimed is:

1. A testability circuit incorporated in an LSI system comprising:
   a plurality of master modules;
   a plurality of slave modules;
   a common bus for connecting the master modules and the slave modules;
   arbitration means for arbitrating use of the common bus;
   acknowledgement means for prohibiting transmission of a first acknowledgement signal to be transmitted from the arbitration means to a first master module to be tested in a test mode, inputting a second acknowledgement signal generated from the first master module, and providing the second acknowledgement signal to the slave modules;
   mask means for masking other acknowledgement signals to be transmitted from the arbitration means to master modules other than the first master module;
   input-output means for writing to a memory portion in the first master module, and reading data out of the memory portion in the test mode; and
   ordinary operation means for setting the first master module and the slave modules in an ordinary operation mode and maintaining the acknowledgement means and mask means in the test mode.

2. A testability circuit according to claim 1, wherein the acknowledgement means comprises two tri-state buffers provided between the arbitration means and the first master module, and a selector, one of the tri-state buffers stops the first acknowledgement signal generated from the arbitration means to the first master module in the test mode, the other tri-state buffer outputs a second acknowledgement signal generated from the first master module to the first master module in the test mode, and the second acknowledgement signal is outputted to the slave modules through the selector.

3. A circuit testability according to claim 1, wherein the mask means comprises an AND gate, the input terminals of the AND gate are connected to a control line for transmitting a state of the test mode and a control line for transmitting the acknowledgement signals outputted from the arbitration means, and the output terminal of the AND gate is connected to master modules other than the first master module.

4. A circuit testability according to claim 1, wherein the ordinary operation means comprises an ordinary operation mode control line for designating start of an ordinary operation mode, and an OR gate for inputting an inversion level of a test mode control line inverted by the inverter for designating start of the test mode.

5. A system LSI having a test facilitating circuit, comprising:
   a plurality of slave modules to be tested;
   a first master module for controlling a test operation for the slave modules in a test operation mode;
   at least a second master module other than the first master module;
   a common bus used for connecting the master modules with the slave modules to transfer data between them;
   common bus arbitration means for arbitrating the use of the common bus and for inputting request signals to request the use of the common bus transferred from the first master module and the at least second master module and for outputting a first acknowledgement signal to permit the use of the common bus;
   acknowledgement signal control means for withholding the first acknowledgement signal transferred from the common bus arbitration means to the first master module and for transferring a second acknowledgement signal to the first master module permitting the use of the common bus for the first master module in the test operation mode;
   mask means for withholding the at least third acknowledgement signal transferred from the common bus arbitration means to the at least second master module in the test operation mode;
   test mode set means for setting the first master module, the mask means, and the acknowledgement signal control means into the test operation mode;
   switch means for entering the first master module into a normal operation mode while the acknowledgement signal control means is in the test operation mode; and wherein the first master module outputs the second acknowledgement signal at all times, and in the normal operation mode the acknowledgement signal control means withholds the second acknowledgment signal transferred from the first master module, and in the test operation mode the second acknowledgement signal transferred from the first master module is sent to itself through the acknowledgement signal control means.

6. A system LSI having a test facilitating circuit according to claim 5, wherein the test mode set means comprises inverters;

the mask means comprises an AND gate, the AND gate disposed between the at least second master module and the common bus arbitration means;

the acknowledgement signal control means comprises a first tri-state buffer disposed between the first master module and the common bus arbitration means, being supplied from the first master module, and a second tristate buffer being incorporated between the first master module and the common bus arbitration means and supplied from the common bus arbitration means; and the switch means comprises an OR gate.

7. A method of testing an LSI system comprising a first master module and a plurality of other master modules, a plurality of slave modules, a common bus connecting the master modules and the slave modules, and arbitration means for arbitrating the use of the common bus, comprising the steps of:

setting a test mode to an active level;

allowing only the first master module from among the master modules, to use the common bus by disabling acknowledgement signals originating in the arbitration means;

supplying an acknowledgement signal from the first master module to the first master module and the slave modules;

writing common bus control and address and data for the slave modules to the first master module via a test interface;

setting the first master module and the slave modules into an ordinary operation mode; and testing the slave modules by writing and reading the slave modules from the first master module.

* * * * *